United States Patent
Li et al.

(10) Patent No.: US 12,400,363 B2
(45) Date of Patent: Aug. 26, 2025

(54) DEVICE AND METHOD FOR IMPROVED FIDUCIAL MARKER DETECTION

(71) Applicant: Intel Corporation, Santa Clara, CA (US)

(72) Inventors: Yi Li, Chandler, AZ (US); Hong Seung Yeon, Chandler, AZ (US); Nicholas Haehn, Scottsdale, AZ (US); Wei Li, Chandler, AZ (US); Raquel De Souza Borges Ferreira, Ocala, FL (US); Minglu Liu, Chandler, AZ (US); Robin McRee, Chandler, AZ (US); Yosuke Kanaoka, Chandler, AZ (US); Gang Duan, Chandler, AZ (US); Arnab Roy, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 523 days.

(21) Appl. No.: 17/902,907

(22) Filed: Sep. 5, 2022

(65) Prior Publication Data
US 2024/0078702 A1     Mar. 7, 2024

(51) Int. Cl.
*G06T 7/73*     (2017.01)
*H01L 21/68*   (2006.01)
*H01L 23/544*  (2006.01)

(52) U.S. Cl.
CPC ............ *G06T 7/74* (2017.01); *H01L 21/681* (2013.01); *H01L 23/544* (2013.01); *G06T 2207/20081* (2013.01); *G06T 2207/30204* (2013.01); *H01L 2223/54426* (2013.01)

(58) Field of Classification Search
CPC ............ G06T 7/74; G06T 2207/20081; G06T 2207/30204; G06T 7/73; H01L 21/681; H01L 23/544; H01L 2223/54426
See application file for complete search history.

(56) References Cited

U.S. PATENT DOCUMENTS

| | | | |
|---|---|---|---|
| 9,454,084 B2 * | 9/2016 | Lyulina | G03F 7/70141 |
| 2015/0146188 A1 * | 5/2015 | Lyulina | G03F 7/70141 |
| | | | 356/614 |

OTHER PUBLICATIONS

S.W. Liang et al., "High Performance and Energy Efficient Computing with Advanced SoIC™ Scaling", Proceedings of the IEEE 72nd Electronic Components and Technology Conference, May 31-Jun. 3, 2022, pp. 1090-1094, San Diego, CA, USA.

* cited by examiner

*Primary Examiner* — Roy M Punnoose
(74) *Attorney, Agent, or Firm* — Viering, Jentschura & Partner mbB

(57) ABSTRACT

A method for recognizing a reference point associated with a fiducial marker including the steps of: obtaining or receiving image data of the fiducial marker; determining the degree of which the image data of the fiducial marker is aligned with one or more reference images; of which if the degree of alignment is determined to be less than an acceptable threshold predicting a set of coordinates of the reference point associated with the fiducial marker; incorporating the set of coordinates with the image data to form a modified image data; and determining the degree of which the modified image data of the fiducial marker is aligned with one or more reference images.

20 Claims, 11 Drawing Sheets

| S.N. | TECHNIQUES | ADVANTAGES |
|---|---|---|
| 1 | Histogram equalization | This technique is very simple. Only the global histogram equalization can be done completely automatically. |
| 2 | Adaptive Histogram equalization | This method has advantage of being quick making it simple based on transform adaptive histogram. The results of this technique shows outperform from commonly used enhancement technique like histogram equalization. |
| 3 | Fuzzy Logic Technique | The fuzzy rule-based approach is a powerful method for formulation of expert system in a comprehensive way. Fuzzy logic represents the good mathematical frame works to deal with uncertainty of information. |
| 4 | Nuro Fuzzy System | The neural networks used for identification of noise using the statistical parameters whereas fuzzy logic is used for enhancement purpose. The system behaves like a neural network where learning of parameters occurs and at the time of execution it behaves like a fuzzy. |
| 5 | Unsharp Masking | This is the simple technique. In this technique, a fraction of the high-pass filtered image is added to the original one to form the enhanced image. It has two major drawbacks. First it enhances the noise present in the image. Second, it enhances too much the sharp transitions which lead to excessive overshoot on sharp edges. |
| 6 | Contrast Stretching | Contrast Stretch is the simplest contrast stretch algorithm that stretches the pixel values of a low-contrast image or high-contrast image by extending the dynamic range acros the whole image spectrum |
| 7 | Thresholding transformations | Thresholding transformations are particularly useful for segmentation in which we want to isolate an object of interest from a background. |
| 8 | Log Transformation | Log Transformation is Useful for enhancing details in the darker regions of the image at the expense of detail in the brighter regions the higher-level values. |
| 9 | Local Enhancement | This technique is very simple to use. In this technique we define a define square or rectangular neighborhood and move the center from pixel to pixel. |

FIG. 2E

DEVICE AND METHOD FOR IMPROVED FIDUCIAL MARKER DETECTION

TECHNICAL FIELD

Various aspects relate to methods, devices, and non-transitory computer-readable medium for fiducial maker detection or recognition.

BACKGROUND

Fiducial markers, also referred to as fiducials, are printed patterns on an object to facilitate alignment during a manufacturing process. In the semiconductor industry, fiducial markers may be printed on a semiconductor substrate to assist in precise alignment during a packaging process, such as a semiconductor die bonding process, to accurately locate and place parts on the semiconductor substrate that may include integrated circuit (IC) boards or printed circuit boards (PCBs).

As fiducials serve as the reference position during a manufacturing process, it is critical for image capturing devices or image sensors used in manufacturing processes to be able to extract and locate them accurately and repeatedly.

It is known that image processing or machine vision devices or systems may be adopted for fiducial recognition based on captured image(s) of the fiducial marker (which may include a circular-shaped fiducial marker) obtained using an alignment camera. The fiducial mark may be filled in to resemble a dot or an annulus.

The result of a fiducial recognition process typically depends on three factors. (1) Fiducial quality, which would be affected by the fiducial design, process parameters, material properties, etc. (2) Fiducial image quality captured by the alignment camera, and camera settings (for example gains, exposure), light/optic settings which may influence the image contrast, image elasticity, and brightness. (3) software algorithm, including the algorithm for pattern training, pattern search, pattern matching, and reference point, such as center coordinates calculation.

Due to the varied materials, process parameters, and artificial design being introduced in the fiducial fabrication, the current fiducial recognition process may not be robust enough to provide consistent detection or recognition. Inconsistencies may lead to high variance in the fiducial detection and cause a high standard deviation or high sigma in a manufacturing process, such as a semiconductor packaging process.

A current solution to mitigate the above is to improve fiducial qualities by fine-tuning process parameters or changing materials and fiducial designs. However, the current solution inadvertently increases labor force and cost for the setup, test, and evaluations. A need exists to reduce costs associated with the aforementioned labor, setup, test, and evaluations.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which:

FIG. 2E is a table depicting various examples of pre-processing techniques that may be applied to the images including one or more fiducial markers.

DESCRIPTION

Figure 1:
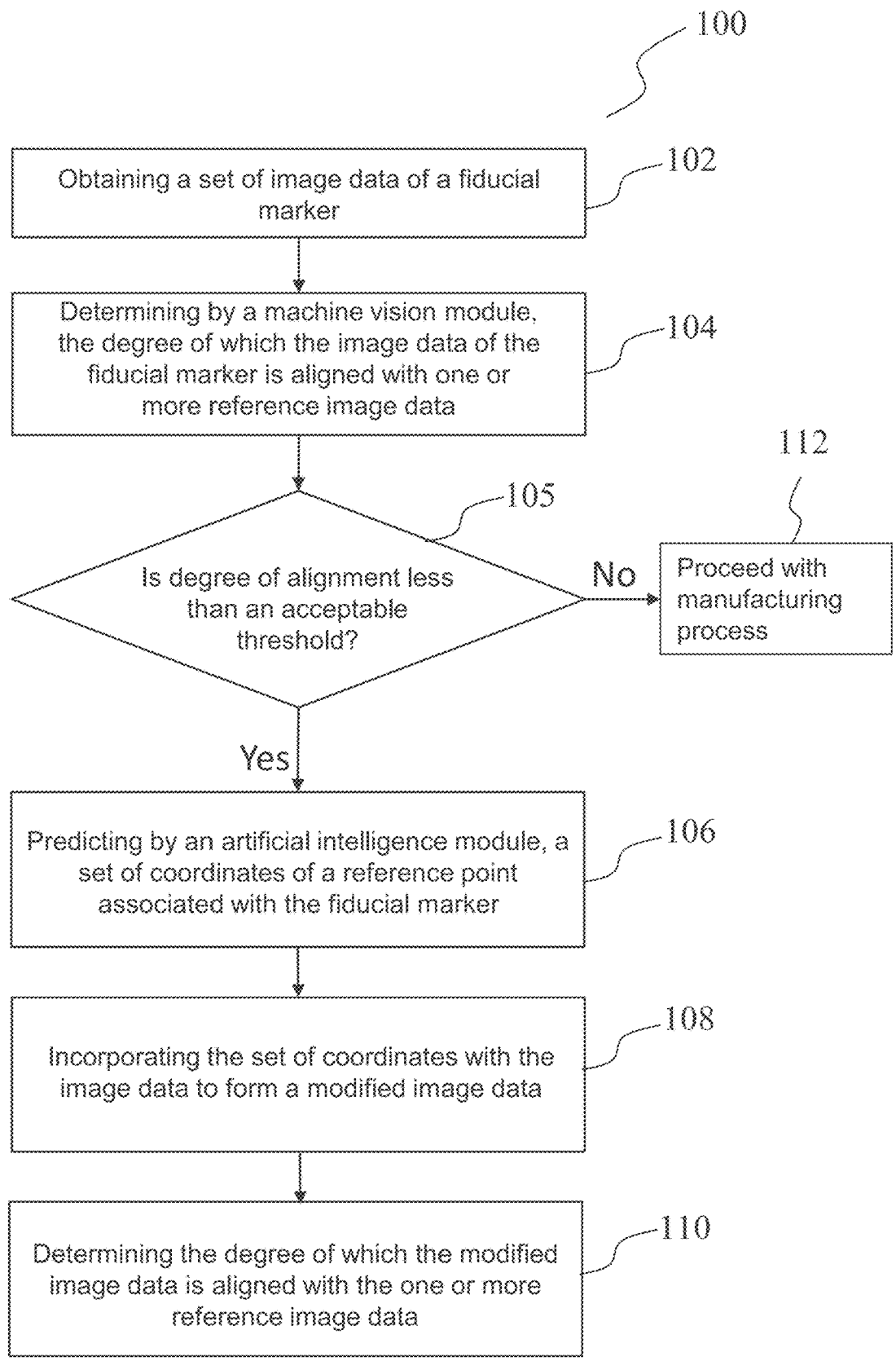
FIG. 1 shows a flow diagram of a method for recognizing a reference point associated with a fiducial marker.

The following detailed description refers to the accompanying drawings that show, by way of illustration, specific details and aspects in which the disclosure may be practiced. One or more aspects are described in sufficient detail to enable those skilled in the art to practice the disclosure. Other aspects may be utilized and structural, logical, and/or electrical changes may be made without departing from the scope of the disclosure. The various aspects of the disclosure are not necessarily mutually exclusive, as some aspects can be combined with one or more other aspects to form new aspects or embodiments. Various aspects are described in connection with methods and various aspects are described in connection with devices. However, it may be understood that aspects described in connection with methods may similarly apply to the devices, and vice versa.

The term "exemplary" may be used herein to mean "serving as an example, instance, or illustration". Any aspect or design described herein as "exemplary" is not necessarily to be construed as preferred or advantageous over other aspects or designs.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and in the claims expressly refer to a quantity greater than one. Accordingly, any phrases explicitly invoking the aforementioned words (e.g., "a plurality of (objects)", "multiple (objects)") referring to a quantity of objects expressly refer to more than one of the said objects. The terms "group (of)", "set (of)", "collection (of)", "series (of)", "sequence (of)", "grouping (of)", etc., and the like in the description and in the claims, if any, refer to a quantity equal to or greater than one, i.e. one or more.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art. Any type of information, as described herein, may be handled for example via one or more processors in a suitable way, e.g. as data.

The terms "processor" or "controller" as, for example, used herein may be understood as any kind of entity that allows handling data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "memory" detailed herein may be understood to include any suitable type of memory or memory device, e.g., a hard disk drive (HDD), a solid-state drive (SSD), a flash memory, etc.

The term "module" detailed herein refers to, or forms part of, or includes an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

Differences between software and hardware implemented data handling may blur. A processor, controller, and/or circuit detailed herein may be implemented in software, hardware, and/or as a hybrid implementation including software and hardware.

The term "system" (e.g., an artificial intelligence system, a machine learning system, a computing system, etc.) detailed herein may be understood as a set of interacting elements, of which the elements can be, by way of example and not of limitation, one or more mechanical components, one or more electrical components, one or more instructions (e.g., encoded in storage media), and/or one or more processors, and the like.

The term "semiconductor die" as used herein refers to both the singular and plural form of the words, and accordingly can refer to both a single semiconductor device and multiple semiconductor devices.

The term "semiconductor substrate" detailed herein may include an organic package substrate, a coreless substrate, and a high-density build-up (HDBU) laminate substrate.

The term "interconnect" detailed herein may include a silicon bridge (Si-bridge), a glass bridge, a molded organic bridge with fine line/space structures used for die-to-die high bandwidth communications, and an embedded multi-die interconnect bridge (EMIB).

FIG. 1 shows an example of a method 100 for recognizing a fiducial marker according to various aspects, including the steps of
  step 102: obtaining image data of the fiducial marker;
  step 104: determining by a machine vision module, the degree of which the image data of the fiducial marker is aligned with one or more reference image data;
  step 105: for which if the degree of alignment is determined to be less than an acceptable threshold;
  step 106: predicting by an artificial intelligence module, a set of coordinates associated with a reference point associated with the fiducial marker;
  step 108: incorporating the set of coordinates with the image data to form a modified image data; and
  step 110: determining the degree of which the modified image data is aligned with the one or more reference image data.

In step 102, the image data may be acquired from an image sensor, such as an industrial-grade smart camera. Non-limiting examples of the smart camera include a GigE camera having a resolution up to thirty-one 31 megapixels (MP). In some aspects, the image data may include at least one of the following: a shape of the fiducial marker, a material type of the fiducial marker, the image sensor source, and settings. The camera may be aligned such that the field of view (FOV) is parallelly aligned to the object surface including the fiducial marker, before image data is captured.

In step 104, the machine vision module may derive a geometric model and/or sub-models of the fiducial marker and find a pose of the geometric model of the fiducial marker. The machine vision module may be configured to enable a user to input geometric model shape, for example, a circular shape, and geometric model dimensions. The machine vision module may include various search algorithms to search and compare the image data of the fiducial marker with a database including one or more reference image data, to determine if is aligned based on a reference point in the form of center coordinates of the fiducial marker derived from the pose information.

In some aspects, the machine vision module may include a fiducial detection tool or software, which may include a pattern matching tool, such as Cognex PatMax™ pattern matching tool configured to compare each captured image (also referred to as model image) including the fiducial marker with a database of previously captured images (also referred to as search images or reference images) of fiducial markers to determine if the model image is properly aligned for purpose of a manufacturing process, such as a semiconductor die bonding process.

The degree of alignment may be quantified and expressed in the form of a search score or a normalized search score, where a score of 0.0 indicates no similarity between the geometric model and the searched feature, to 1.0, which indicates a perfect match. An acceptable threshold may be obtained based on statistical manipulation of historical data. It is appreciable that the search scores may vary depending on a scale utilized. For example, in another embodiment, the search score may vary from 0 to 10,000 and 7,000 being defined as an acceptable threshold.

In step 105, if the degree of alignment is not less than an acceptable threshold, no further prediction by the artificial intelligence module is required and a next step of the manufacturing process can proceed-step 112.

In step 106, the artificial intelligence module may be activated if the degree of alignment is less than an acceptable threshold. The acceptable threshold may be a pre-determined or a pre-defined threshold may further include pre-processing the image data. Examples of such pre-processing may include at least one of the following: image equalization, contrast stretching, unsharp masking, thresholding transformations, log transformation, local enhancement, fuzzy logic or neuro-fuzzy based manipulation.

In step 108, the step of incorporating the set of coordinates with the image data to form a modified image data may include defining or adding the reference point on the image data, and may include changes associated with the pre-processing of the image data.

In step 110, the step of determining the degree of which the modified image data is aligned with the one or more reference image data may include sending the modified image data back to the machine vision module for a check similar to steps 104 and 105.

Based on step 110, should the degree of alignment determined to be less than the acceptable threshold, manual intervention or a re-start of the fiducial recognition process may be contemplated.

In some aspects, the machine vision module and the artificial intelligence module may be integrated, forming part of a processor or controller.

Figure 2A:
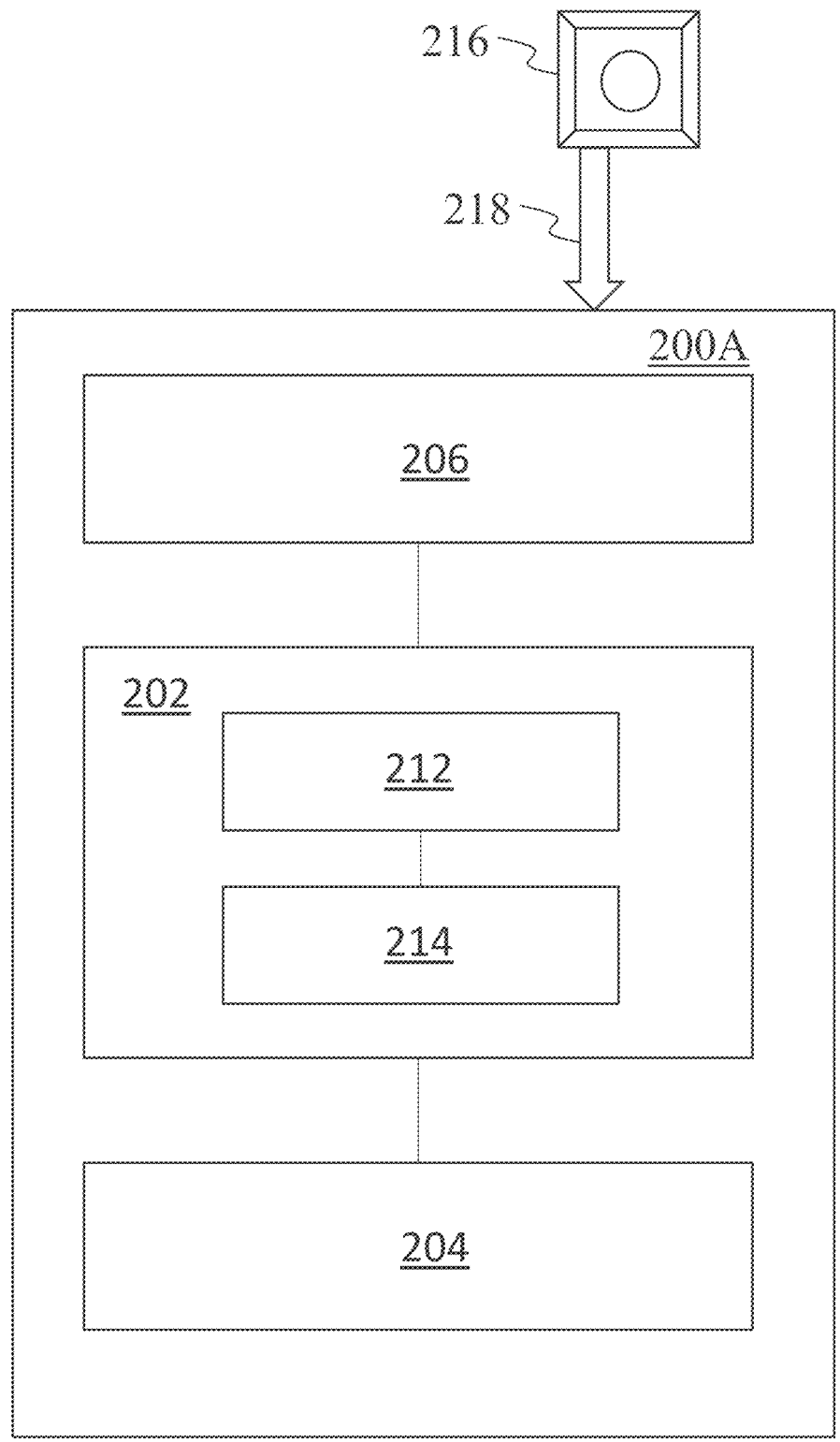
FIG. 2A shows a schematic block diagram of a device for recognizing a reference point associated with a fiducial marker.

FIG. 2A illustrates a schematic block diagram of a device 200A for fiducial marker recognition including: one or more processor(s) 202; and a memory 204 having instructions stored therein, the instructions, when executed by the one or more processor(s) 202, cause the one or more processor(s) 202 to: obtain image data of the fiducial marker; determine the degree of which the image data of the fiducial marker is aligned with one or more reference images; for which if the degree of alignment is determined to be less than an acceptable threshold, predict a set of coordinates of the reference point associated with the fiducial marker; incorporate or combine the set of coordinates with the image data to form a modified image data; and determine the degree of which the modified image data of the fiducial marker is aligned with one or more reference images.

In some aspects, the device 200 may include a communication interface 206 configured to interface with one or more input/output devices, for example, to receive input image data from one or more image sensors 216.

The device 200A may be suited for deployment in an industrial manufacturing process, for example, a semiconductor packaging process, and more specifically a semiconductor die bonding process. The device 200A may be interfaced with one or more alignment cameras 216 used for checking the alignment of a semiconductor substrate before placement of a semiconductor die. To facilitate the checking of alignment, one or more fiducial markers printed on the semiconductor substrate may be used.

In some aspects, the processor 202 may include a machine vision module 212 and an artificial intelligence module 214 for recognition of fiducial markers and prediction of a reference point, such as a center, on the fiducial marker(s).

Figure 2B:
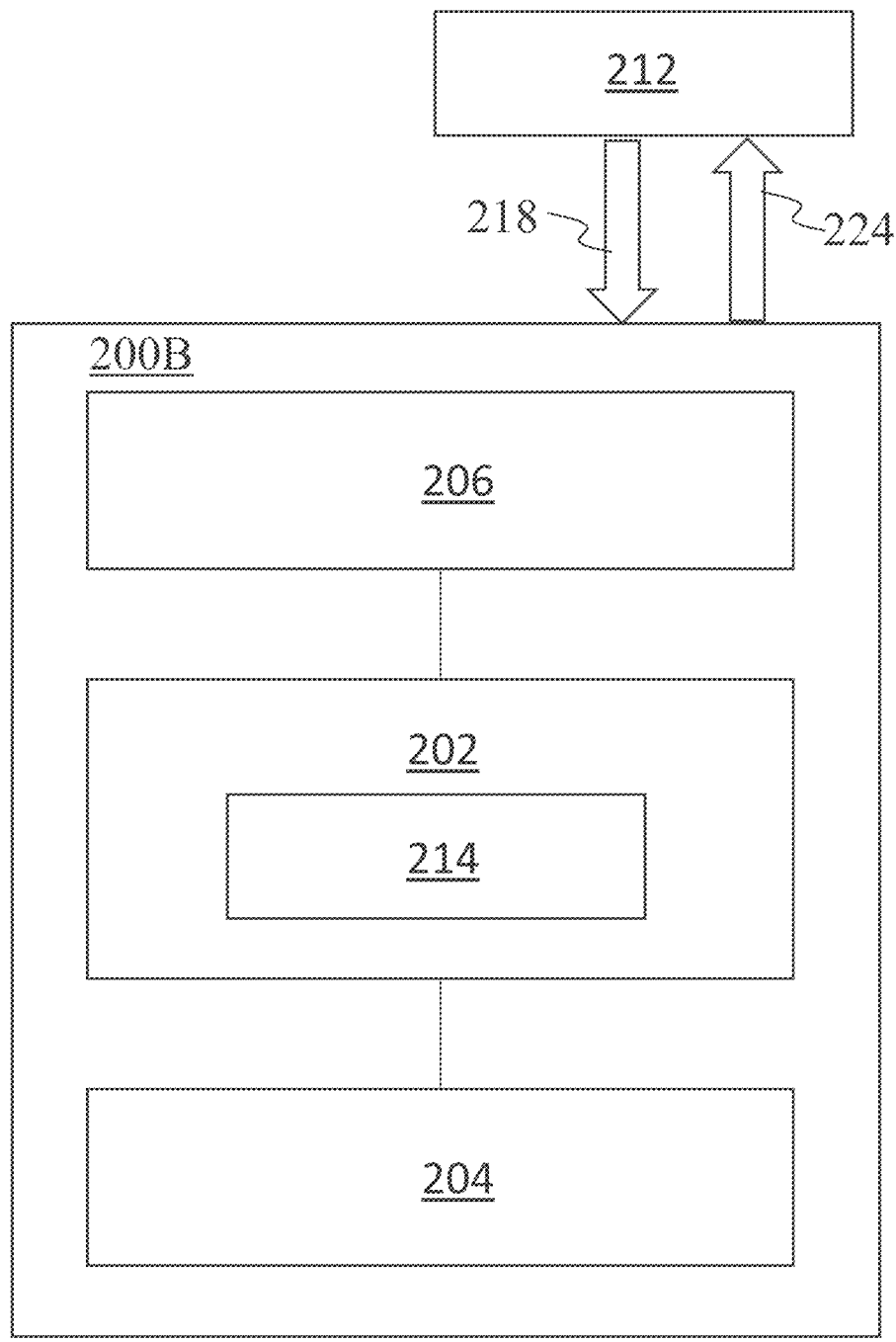
FIG. 2B shows a schematic block diagram of another device for recognizing a reference point associated with a fiducial marker.
Figure 2C:
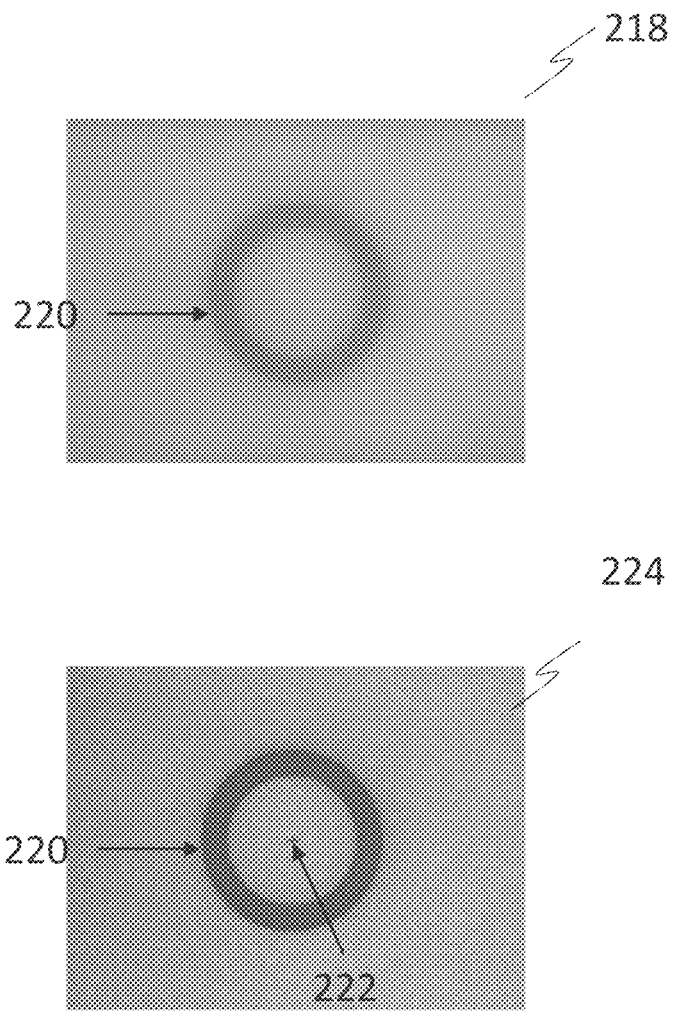
FIG. 2C illustrates an image data and a modified image data respectively after predicting a reference point associated with a fiducial marker.

The machine vision module 212 may be arranged in data communication with the image sensor 216 which is configured to obtain one or more images 218 (also referred to as model image) as shown in FIG. 2C, each model image 218 including one or more fiducial markers 220. The image 218 may then be processed (e.g. via parsing, extracting) to obtain image data which are then compared with previous captured/stored images (also referred to as search images) associated with aligned fiducial markers 220, so as to determine a degree of alignment between the model image 218 and the search images. The determination of alignment may be based on a search for a similar image in the database and assigning a search score based on a degree of alignment between the model image and search image(s). In some aspects, the search score may be normalized between 0 and 1.

A threshold of the search source may be pre-defined or determined, such that when the search score is below the pre-defined value, the artificial intelligence module 214 is activated to predict a set of coordinates associated with a reference point on the fiducial marker. In some aspects, the reference point is a center or centroid 222 of the fiducial marker 220.

The predicted set of coordinates associated with the reference point 222 may be included, combined, and/or concatenated in the image data to form a modified image data 224; and the comparison with the search images to determine a degree of alignment between the modified image data 224 and the search images are performed. If the degree of alignment still fails to meet the requisite threshold after the modified image data 224 is compared with the reference or search images, manual intervention may be contemplated. If the degree of alignment is above the threshold, the manufacturing process proceeds, for example, to a semiconductor die bonding stage.

FIG. 2B illustrates a schematic block diagram of another embodiment of the device 200B for fiducial marker recognition. The device 200B includes one or more processor(s) 202; and a memory 204 having instructions stored therein, the instructions, when executed by the one or more processor(s) 202, cause the one or more processor(s) 202 to receive or obtain image data associated with a fiducial marker from a machine vision module; predict a set of coordinates of the reference point associated with the fiducial marker; incorporate or combine the set of coordinates with the image data to form a modified image data, and determine the degree of which the modified image data of the fiducial marker is aligned with one or more reference images.

In some aspects, the device 200 may include a communication interface 206 configured to interface with one or more input/output devices, for example, to receive input image data from a machine vision module. It is contemplated that the device 200B may be interfaced with an existing or known machine vision module 212 for the detection and/or alignment of fiducial markers for various applications.

In some aspects, the device 200B may be activated by an activation signal before receiving image data associated with a fiducial marker.

FIG. 2C shows examples of the model image 218 and modified image 224 as described.

Figure 2D:
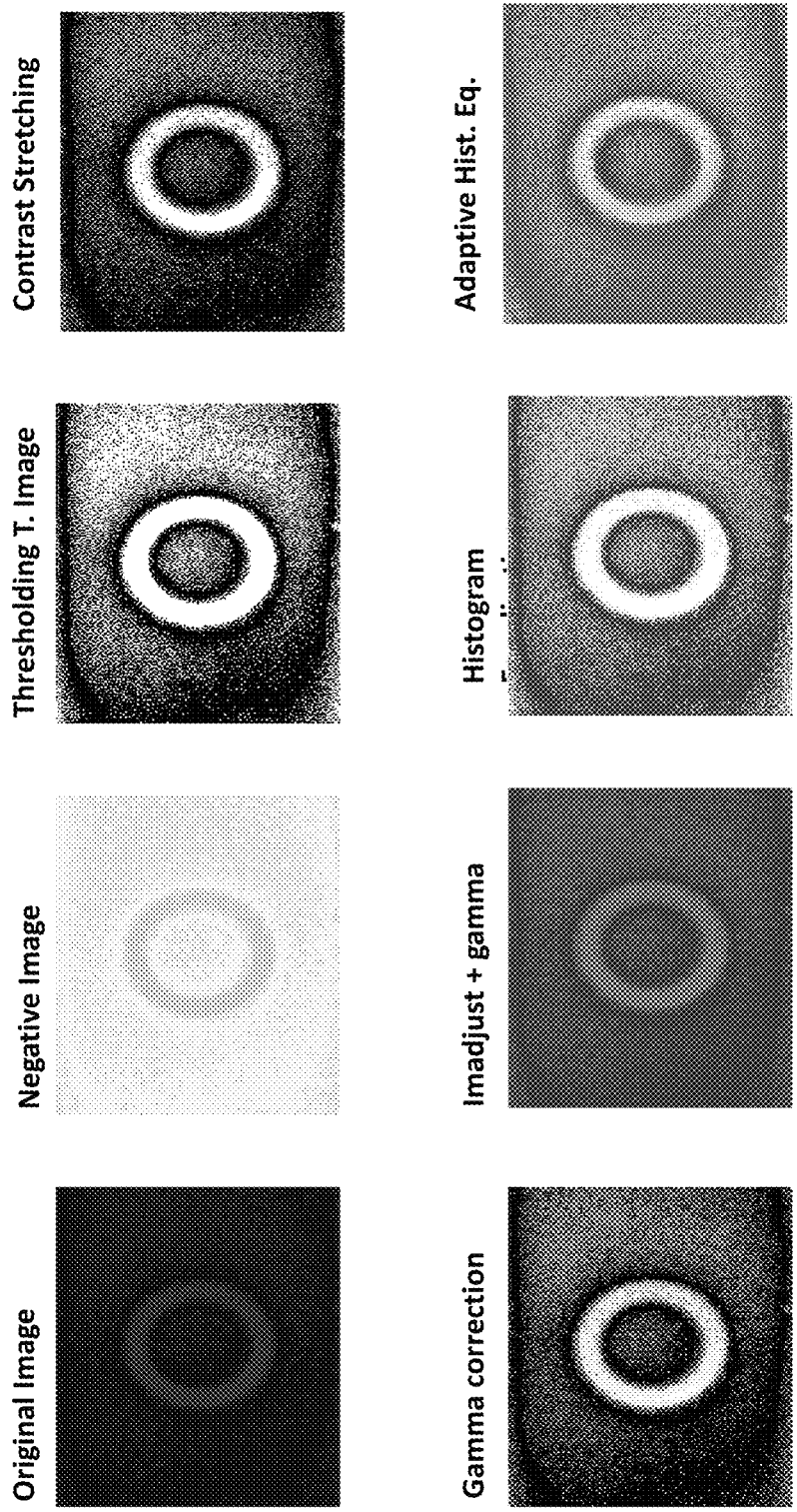
FIG. 2D illustrates various examples of pre-processing of images including one or more fiducial markers.

In some aspects, the artificial intelligence module may be configured to perform pre-processing of the model image 218 as part of the formation of the modified image 224. Various pre-processing examples are shown in FIG. 2D and FIG. 2E, which may include pre-processing functions such as histogram equalization, adaptive histogram equalization, fuzzy logic technique, neuro-fuzzy system, unsharp masking, contrast stretching, thresholding transformations, log transformation, local enhancement, smoothening, contrast adjustment, brightness adjustment, and regularization, etc. The pre-processing step(s) may be performed before locating the reference point.

In some aspects, the artificial intelligence module may be trained before deployment. The training may include a selection of input set, the input set including fiducial images captured during one or more actual manufacturing processes. The input set may include a training set and a test set. In some aspects, 80% of the fiducial images captured during the actual manufacturing process is used as training image set, and 20% of the fiducial images is used as test image set.

In some aspects, the training process may include a supervised, an un-supervised, or a hybrid learning process.

In some aspects, the artificial intelligence module 214 may include a machine learning algorithm, an artificial neural network, a Convolutional Neural Network (CNN), a genetic algorithm, an evolutionary algorithm, a fuzzy logic algorithm, or one or more combinations of the aforementioned algorithms.

Figure 3:
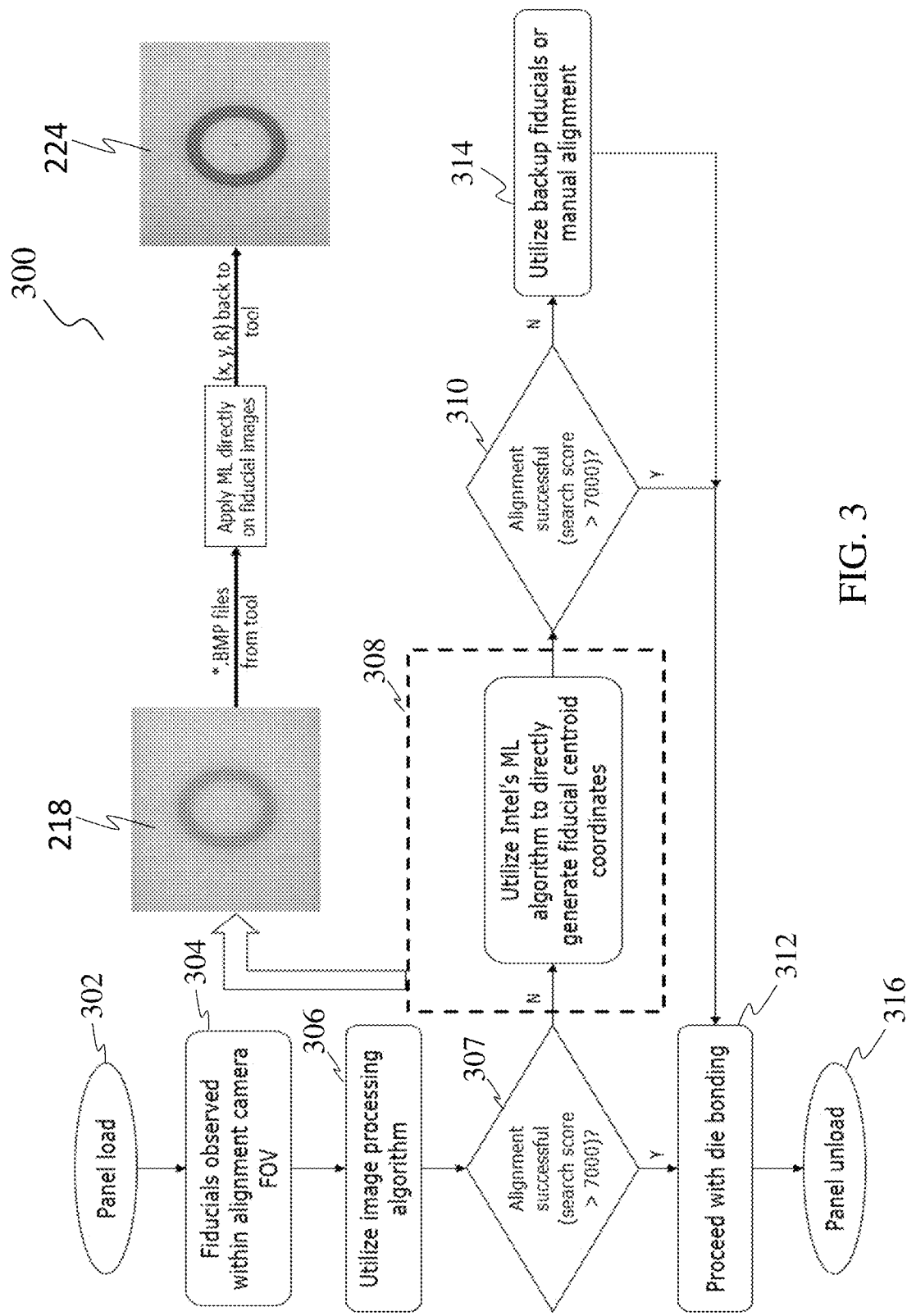
FIG. 3 is a flow diagram of a method for checking a semiconductor substrate for alignment before a semiconductor die bonding process, based on the method for recognizing a reference point associated with one or more fiducial markers.

FIG. 3 shows another aspect of the present disclosure including a method 300 for checking a fiducial marker for alignment before a semiconductor die bonding process, in particular semiconductor die bonding process involving the placement of interconnects.

The method 300 may include the method for recognizing a fiducial marker and/or predicting a reference point associated with the fiducial marker as depicted in FIG. 1. The method 300 may include the following steps:

step 302: loading a panel including a semiconductor packaging substrate, the semiconductor packaging substrate includes a fiducial marker.

step 304: obtaining image data of the area including the fiducial marker (see FIG. 2C for example). The image data may be obtained from one or more industrial cameras positioned at locations above the panel and aligned so as to ensure the fiducial marker is within the field of vision of the one or more cameras.

step 306: determining by an image processing algorithm, the degree of which the image data of the fiducial marker is aligned with one or more reference images.

step 307: for which if the degree of alignment is determined to be less than an acceptable threshold.

step 308: predicting by an artificial intelligence module, a set of coordinates of a reference point associated with the fiducial marker, and incorporating the set of coordinates with the image data to form a modified image data.

step 310: determining the degree of which the modified image data is aligned with the one or more reference image data.

step 312: proceeding with the semiconductor die bonding process (after step 307, after step 310, or after step 314).

step 314: based on step 310, if the degree of alignment based on the modified image is less, utilize a backup fiducial or manual alignment.

step 316: Unload panel after semiconductor die bonding is completed.

Figure 4A:
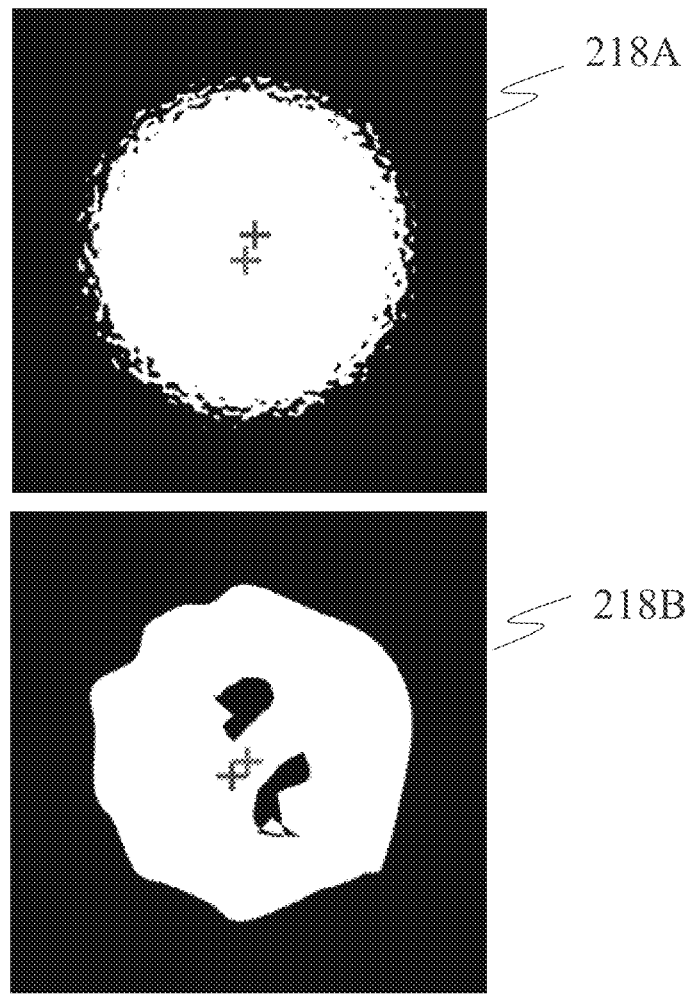
FIG. 4A to 4D show various examples of the application of the method for checking a semiconductor substrate for alignment before a semiconductor die bonding process.

FIGS. 4A to 4D show some examples of cases where the device 200A, 200B, and/or methods 100, 300 were used. FIG. 4A shows two examples of model images 218A, 218B of cases where the search performed by the machine vision module 212 indicates that the degree of alignment is determined to be less than an acceptable threshold. In example 218A, the captured model image 218A shows that the boundary or edge of the fiducial marker is unclear, leading to a misaligned center. In example 218B, the captured image shows that the boundary or edge of the fiducial marker is irregular. For both cases, the artificial intelligence module is utilized further pro-process the model images and predict a reference point, i.e. a center of the fiducial marker.

Figure 4B:
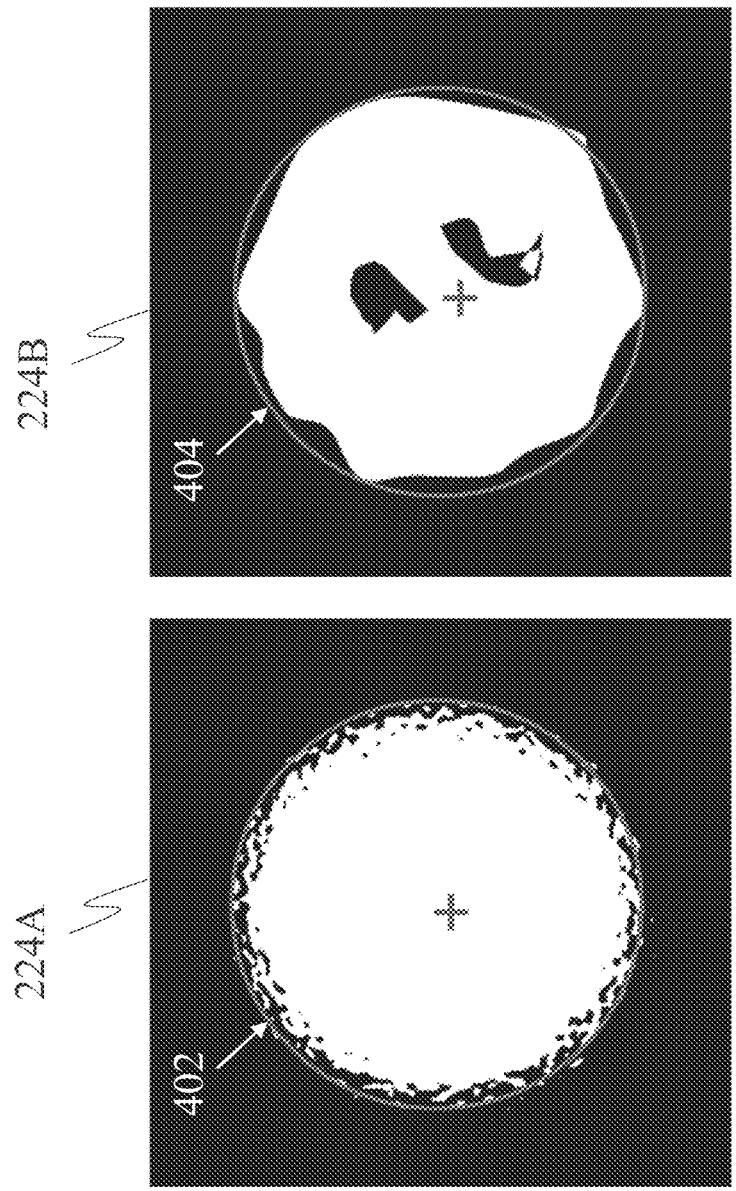

In FIG. 4B, the example 218A is pre-processed to sharpen the edges for better prediction of the center. As shown, a circumference 402 is defined to assist a more accurate and reliable centroid detection. The pre-processed image with the predicted center by the artificial intelligence module on example 218A forms a modified image 224A. The example 218B is pre-processed to regularize the edges (based on estimation, image sharpness enhancement, image contrast adjustment, and/or noise removal techniques) for better prediction of the center. The pre-processed image with the predicted center by the artificial intelligence module on example 218B forms a modified image 224B. In some aspects, the pre-processing may include the detection of edge/boundary points on the model image 218B to construct a circular shape based on the edge and boundary points so as to enhance the accuracy of the predicted center.

Figure 4C:
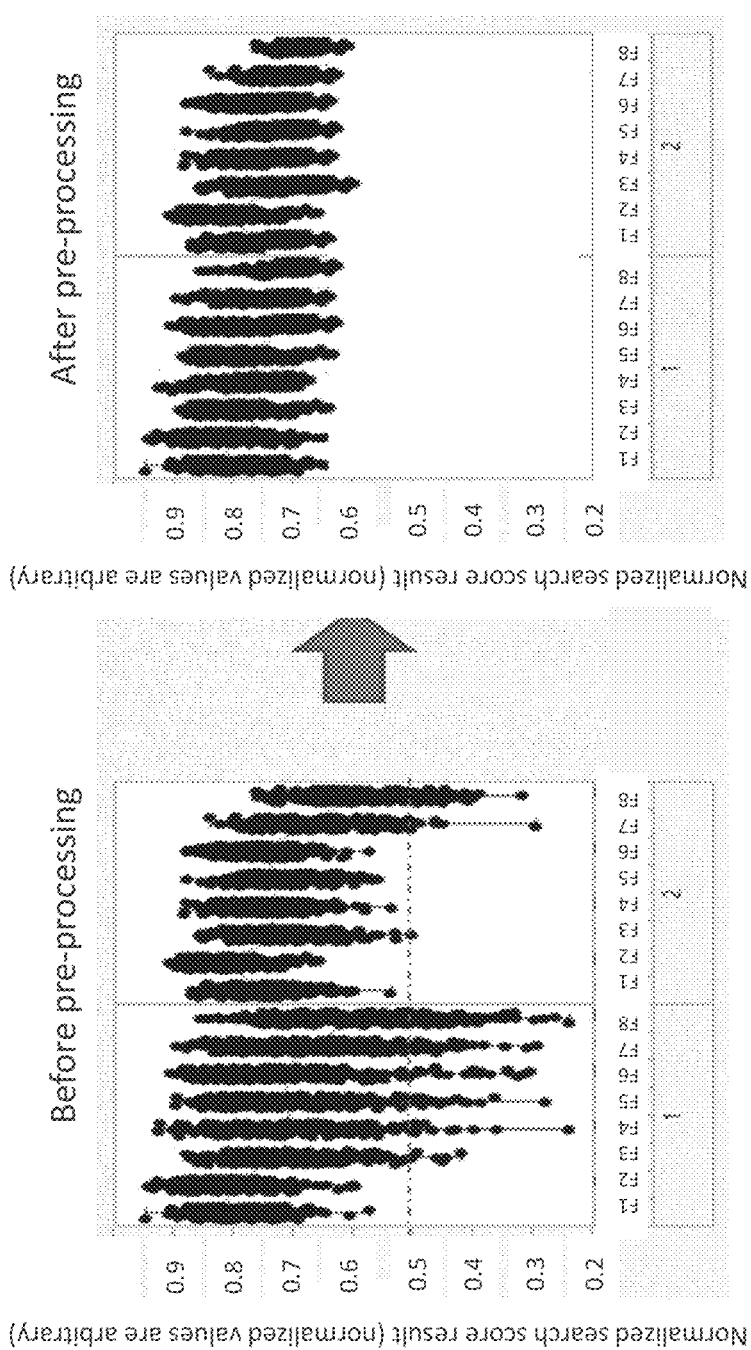
Figure 4D:
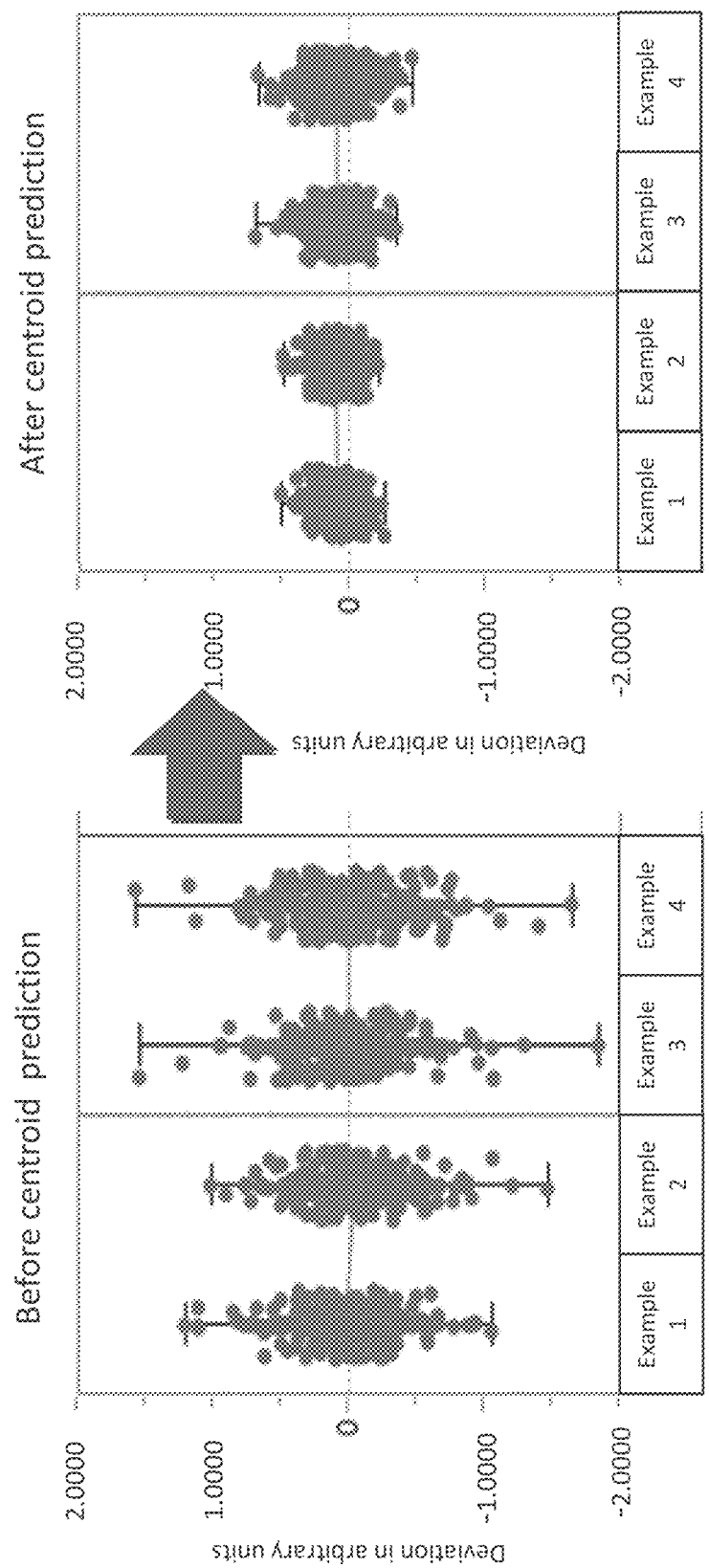

FIG. 4C and FIG. 4D show the apparatus 200A and the method 300 applied to a semiconductor die bonding process.

FIG. 4C shows the results of predicting a center of a fiducial marker after a pre-processing step has been applied to image data associated with fourteen features obtained from two respective semiconductor die bonding heads. The pre-processing step includes image resolution enhancement such as contrast, brightness, and edge sharpness improvement. The graph on the left is before pre-processing and associated with the raw model image 118A, and the graph on the right is associated with the modified image 224A. The acceptable threshold as shown in FIG. 4C is defined as 7000. The results demonstrate the artificial intelligence-based prediction showing a much smaller sigma or standard deviation of search score, with most results showing the search score above 7000.

FIG. 4D demonstrates the efficacy of the artificial intelligence module in predicting the reference point (centroid coordinates) of fiducial markers. As indicated by the box plots, the predicted results show a reduced variation of error between the true centroid coordinates and the predicted centroid coordinates, indicating consistent results, which will lead to a more consistent and stable die placement accuracy.

The following examples pertain to further exemplary implementations.

Example 1 is a method for recognizing a reference point associated with a fiducial marker including the steps of: obtaining or receiving image data of the fiducial marker; determining the degree of which the image data of the fiducial marker is aligned with one or more reference images; for which if the degree of alignment is determined to be less than an acceptable threshold, predicting a set of coordinates of the reference point associated with the fiducial marker; incorporating the set of coordinates with the image data to form a modified image data; and determining the degree of which the modified image data of the fiducial marker is aligned with one or more reference images.

In Example 2, the reference point may be a center of the fiducial marker, and the step of predicting the set of coordinates of the reference point includes inputting the image data of the fiducial marker into the artificial intelligence module for estimating or calculating the set of coordinates corresponding to the center of the fiducial marker.

In Example 3, the method further includes a step of pre-processing the image data before predicting the set of coordinates.

In Example 4, if the degree of alignment between the modified image data and the one or more reference images is determined to be less than the acceptable threshold, the method includes a step of manually aligning the fiducial marker.

In Example 5, if the degree of alignment between the generated set of coordinates and the reference point is determined to be more than the acceptable threshold, the method optionally includes the step of proceeding with a manufacturing step, such as a semiconductor die bonding step.

In Example 6, the image sensor is optionally an alignment camera.

In Example 7, the set of coordinates of a circular fiducial marker may include an x-axis coordinate, a y-axis coordinate, and a radius.

Example 8 is a device for fiducial marker recognition including: one or more processor(s); and a memory having instructions stored therein, the instructions, when executed by the one or more processor(s), cause the one or more processor(s) to: obtain or receive image data of the fiducial marker; determine the degree of which the image data of the fiducial marker is aligned with one or more reference images; for which if the degree of alignment is determined to be less than an acceptable threshold, predict a set of coordinates of the reference point associated with the fiducial marker; incorporate or combine the set of coordinates with the image data to form a modified image data, and determine the degree of which the modified image data of the fiducial marker is aligned with one or more reference images.

In Example 9, the reference point is a center of the fiducial marker, and the one or more processor(s) includes an artificial intelligence module configured to receive the image data of the fiducial marker and predict the set of coordinates corresponding to the center of the fiducial marker.

In Example 10, the one or more processor(s) is further configured to pre-process the image data before the prediction of the set of coordinates of the reference point.

In Example 11, the image data is obtained from an image sensor, the image sensor including an alignment camera.

In Example 12, the fiducial marker is a circular-shaped fiducial marker and the set of coordinates include an x-axis coordinate, a y-axis coordinate, and a radius.

In Example 13, the one or more processor(s) includes a machine vision module to obtain or receive image data of the fiducial marker and determine a degree of alignment between the image data of the fiducial marker and one or more reference images.

Example 14 provides a method for checking a fiducial marker for alignment before a semiconductor die bonding process including the steps of: loading a panel including a semiconductor packaging substrate, the semiconductor packaging substrate includes a fiducial marker; obtaining or receiving image data of the fiducial marker; determining a degree of alignment between the image data of the fiducial marker and one or more reference images; of which if the degree of alignment is determined to be less than an acceptable threshold, predicting a set of coordinates of the reference point associated with the fiducial marker; incorporating the set of coordinates with the image data to form a modified image data; and determining the degree of alignment between the modified image data and the one or more reference images.

In Example 15, the method optionally includes a step of proceeding with the semiconductor die bonding process if the degree of alignment is above the acceptable threshold.

In Example 16, the reference point is a center of the fiducial marker, and the step of predicting the set of coordinates of the reference point associated with the fiducial marker includes inputting the image data of the fiducial marker into an artificial intelligence module for estimating the set of coordinates corresponding to the center of the fiducial marker.

In Example 17, the method further includes a step of pre-processing the image data before predicting the set of coordinates.

In Example 18, the semiconductor die bonding process includes a placement of interconnects.

Example 19 provides a non-transitory computer-readable medium storing computer executable code including instructions, which, if executed, cause one or more processors to: obtain or receive image data of a fiducial marker; determine a degree of alignment between the image data of the fiducial marker and one or more reference images; of which if the degree of alignment is determined to be less than an acceptable threshold predict a set of coordinates of the reference point associated with the fiducial marker; incorporate the set of coordinates with the image data to form a modified image data; and determine the degree of alignment between the modified image data and the one or more reference images.

In Example 20, the reference point is a center of the fiducial marker, and the one or more processor(s) includes an artificial intelligence module configured to receive the image data of the fiducial marker and predict the set of coordinates corresponding to the center of the fiducial marker.

It should be noted that one or more of the features of any of the examples above may be combined with any one of the other examples.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. A method for recognizing a reference point associated with a fiducial marker comprising the steps of:
   obtaining or receiving image data of the fiducial marker;
   determining a degree of alignment between the image data of the fiducial marker and one or more reference images;
   wherein if the degree of alignment is determined to be less than an acceptable threshold,
   predicting a set of coordinates of the reference point associated with the fiducial marker;
   incorporating the set of coordinates with the image data to form a modified image data; and determining the degree of alignment between the modified image data and the one or more reference images.

2. The method of claim 1, wherein the reference point is a center of the fiducial marker, and the step of predicting the set of coordinates of the reference point associated with the fiducial marker includes inputting the image data of the fiducial marker into an artificial intelligence module for estimating the set of coordinates corresponding to the center of the fiducial marker.

3. The method of claim 1, further comprising a step of pre-processing the image data before predicting the set of coordinates.

4. The method of claim 1, wherein if the degree of alignment between a generated set of coordinates and the reference point is determined to be less than the acceptable threshold, the method further comprises a step of manually aligning the fiducial marker or using another fiducial marker.

5. The method of claim 1, wherein if the degree of alignment between a generated set of coordinates and the reference point is determined to be more than the acceptable threshold, the method further comprises the step of proceeding with a manufacturing step.

6. The method of claim 1, wherein the image data is obtained from an image sensor, the image sensor comprising an alignment camera.

7. The method of claim 1, wherein the fiducial marker is a circular-shaped fiducial marker and the set of coordinates comprise an x-axis coordinate, a y-axis coordinate, and a radius.

8. A device for fiducial marker recognition comprising:
one or more processor(s); and
a memory having instructions stored therein, the instructions, when executed by the one or more processor(s), cause the one or more processor(s) to:
obtain or receive image data of the fiducial marker;
determine a degree of alignment between the image data of the fiducial marker and one or more reference images;
wherein if the degree of alignment is determined to be less than an acceptable threshold,
predict a set of coordinates of a reference point associated with the fiducial marker;
incorporate the set of coordinates with the image data to form a modified image data; and
determine the degree of alignment between the modified image data and the one or more reference images.

9. The device of claim 8, wherein the reference point is a center of the fiducial marker, and the one or more processor(s) comprises an artificial intelligence module configured to receive the image data of the fiducial marker and predict the set of coordinates corresponding to the center of the fiducial marker.

10. The device of claim 8, wherein the one or more processor(s) is further configured to pre-process the image data before the prediction of the set of coordinates of the reference point.

11. The device of claim 8, wherein the image data is obtained from an image sensor, the image sensor comprising an alignment camera.

12. The device of claim 8, wherein the fiducial marker is a circular-shaped fiducial marker and the set of coordinates comprise an x-axis coordinate, a y-axis coordinate, and a radius.

13. The device of claim 8, wherein the one or more processor(s) comprises a machine vision module to obtain or receive image data of the fiducial marker and determine a degree of alignment between the image data of the fiducial marker and one or more reference images.

14. A method for checking a fiducial marker for alignment before a semiconductor die bonding process comprising the steps of:
loading a panel comprising a semiconductor packaging substrate, wherein the semiconductor packaging substrate comprises a fiducial marker;
obtaining or receiving image data of the fiducial marker;
determining a degree of alignment between the image data of the fiducial marker and one or more reference images;
wherein if the degree of alignment is determined to be less than an acceptable threshold,
predicting a set of coordinates of a reference point associated with the fiducial marker;
incorporating the set of coordinates with the image data to form a modified image data; and
determining the degree of alignment between the modified image data and the one or more reference images.

15. The method of claim 14, further comprising a step of proceeding with the semiconductor die bonding process if the degree of alignment is above the acceptable threshold.

16. The method of claim 14, wherein the reference point is a center of the fiducial marker, and the step of predicting the set of coordinates of the reference point associated with the fiducial marker includes inputting the image data of the fiducial marker into an artificial intelligence module for estimating the set of coordinates corresponding to the center of the fiducial marker.

17. The method of claim 14, further comprising a step of pre-processing the image data before predicting the set of coordinates.

18. The method of claim 14, wherein the semiconductor die bonding process includes placement of interconnects.

19. A non-transitory computer-readable medium storing computer executable code comprising instructions, which, if executed, cause one or more processors to:
obtain or receive image data of a fiducial marker;
determine a degree of alignment between the image data of the fiducial marker and one or more reference images;
wherein if the degree of alignment is determined to be less than an acceptable threshold
predict a set of coordinates of a reference point associated with the fiducial marker;
incorporate the set of coordinates with the image data to form a modified image data; and
determine the degree of alignment between the modified image data and the one or more reference images.

20. The non-transitory computer-readable medium of claim 19, wherein the reference point is a center of the fiducial marker, and the one or more processors comprises an artificial intelligence module configured to receive the image data of the fiducial marker and predict the set of coordinates corresponding to the center of the fiducial marker.

* * * * *